(12) United States Patent
Jayamaha et al.

(10) Patent No.: US 11,695,085 B2
(45) Date of Patent: Jul. 4, 2023

(54) PHOTOVOLTAIC DEVICES INCLUDING NITROGEN-CONTAINING METAL CONTACT

(71) Applicant: First Solar, Inc., Tempe, AZ (US)

(72) Inventors: Upali Jayamaha, Toledo, OH (US);
Michael T. Steele, Sylvania, OH (US);
Syed Zafar, Perrsyburg, OH (US)

(73) Assignee: First Solar, Inc., Tempe, AZ (US)

( * ) Notice: Subject to any disclaimer, the term of this patent is extended or adjusted under 35 U.S.C. 154(b) by 420 days.

(21) Appl. No.: 16/245,613

(22) Filed: Jan. 11, 2019

(65) Prior Publication Data

US 2019/0148571 A1     May 16, 2019

Related U.S. Application Data

(60) Continuation of application No. 14/847,738, filed on Sep. 8, 2015, now abandoned, which is a division of application No. 11/935,112, filed on Nov. 5, 2007, now Pat. No. 9,147,778.

(60) Provisional application No. 60/864,709, filed on Nov. 7, 2006.

(51) Int. Cl.
*H01L 31/0224*     (2006.01)
*H01L 31/0749*     (2012.01)
*H01L 31/18*         (2006.01)

(52) U.S. Cl.
CPC .. *H01L 31/022425* (2013.01); *H01L 31/0749* (2013.01); *H01L 31/1828* (2013.01); *H01L 31/1884* (2013.01); *Y02E 10/50* (2013.01)

(58) Field of Classification Search
CPC ......... H01L 31/022425; H01L 31/0749; H01L 31/1828; H01L 31/1884
See application file for complete search history.

(56) References Cited

U.S. PATENT DOCUMENTS

| | | | |
|---|---|---|---|
| 4,064,522 A | 12/1977 | Shaw et al. | |
| 4,081,290 A * | 3/1978 | Bachmann | H01L 21/00 136/258 |
| 4,197,141 A | 4/1980 | Bozler et al. | |
| 4,259,122 A | 3/1981 | Purwin et al. | |
| 4,260,428 A | 4/1981 | Roy | |
| 4,320,249 A | 3/1982 | Yamazaki | |
| 4,338,482 A | 7/1982 | Gordon | |
| 4,485,265 A | 11/1984 | Gordon et al. | |
| 4,543,441 A | 9/1985 | Kumada et al. | |
| 4,568,792 A | 2/1986 | Mooney et al. | |
| 4,582,764 A | 4/1986 | Allerd et al. | |
| 4,598,306 A | 7/1986 | Nath et al. | |
| 5,110,637 A | 5/1992 | Ando et al. | |
| 5,136,346 A | 8/1992 | Komowski | |

(Continued)

FOREIGN PATENT DOCUMENTS

WO     2005088731 A1     9/2005

OTHER PUBLICATIONS

European Search Report, Application No. 07844909.7, dated Mar. 15, 2016.

(Continued)

*Primary Examiner* — Golam Mowla
(74) *Attorney, Agent, or Firm* — MacMillan, Sobanski & Todd, LLC

(57) ABSTRACT

A photovoltaic cell can include a nitrogen-containing metal layer in contact with a semiconductor layer.

8 Claims, 2 Drawing Sheets

(56) References Cited

U.S. PATENT DOCUMENTS

| | | | |
|---|---|---|---|
| 5,248,349 A * | 9/1993 | Foote | H01L 31/1836 |
| | | | 136/260 |
| 5,385,848 A | 1/1995 | Grimmer | |
| 5,676,766 A | 10/1997 | Probst et al. | |
| 6,166,319 A | 12/2000 | Matsuyama | |
| 6,700,057 B2 | 3/2004 | Yasuno | |
| 6,852,614 B1 | 2/2005 | Compaan et al. | |
| 7,123,638 B2 | 10/2006 | Leary et al. | |
| 7,141,863 B1 | 11/2006 | Compaan et al. | |
| 9,147,778 B2 | 9/2015 | Zafar et al. | |
| 2002/0062858 A1 | 5/2002 | Mowles | |
| 2004/0063320 A1 | 4/2004 | Hollars | |
| 2004/0144419 A1 | 7/2004 | Fix et al. | |
| 2005/0183767 A1 | 8/2005 | Yu et al. | |
| 2005/0202589 A1 | 9/2005 | Basol | |
| 2005/0212139 A1 | 9/2005 | Leinikka et al. | |
| 2005/0257824 A1 * | 11/2005 | Maltby | H01L 31/022425 |
| | | | 136/252 |
| 2006/0006482 A1 | 1/2006 | Rieve et al. | |
| 2006/0033160 A1 | 2/2006 | Findikoglu et al. | |
| 2008/0092946 A1 | 4/2008 | Munteanu et al. | |

OTHER PUBLICATIONS

PCT International Preliminary Report and Written Opinion, Application No. PCT/US2007/083758, dated May 12, 2009.

* cited by examiner

PHOTOVOLTAIC DEVICES INCLUDING NITROGEN-CONTAINING METAL CONTACT

CROSS-REFERENCE TO RELATED APPLICATIONS

This application is a continuation of U.S. patent application Ser. No. 14/847,738, filed Sep. 8, 2015, which is a divisional of U.S. patent application Ser. No. 11/935,112, filed Nov. 5, 2007, now U.S. Pat. No. 9,147,778, which claims the benefit of U.S. Patent Application No. 60/864,709, filed Nov. 7, 2006, each of which is hereby incorporated by reference.

TECHNICAL FIELD

This invention relates to photovoltaic cells.

BACKGROUND

During the fabrication of photovoltaic devices, layers of semiconductor material can be applied to a substrate with one layer serving as a window layer and a second layer serving as the absorber layer. The window layer can allow the penetration of solar energy to the absorber layer, where the optical energy is converted into electrical energy. Some photovoltaic devices can use transparent thin films that are also conductors of electrical charge. The conductive thin films can be a transparent conductive oxide (TCO), such as fluorine-doped tin oxide, aluminum-doped zinc oxide, or indium tin oxide. The TCO can allow light to pass through a substrate window to the active light absorbing material and also serves as an ohmic contact to transport photogenerated charge carriers away from the light absorbing material. A back electrode can be formed on the back surface of a semiconductor layer. The back electrode can include electrically conductive material, such as metallic silver, nickel, copper, aluminum, titanium, palladium, or any practical combination thereof, which is sufficiently strong to provide support for the semiconductor layer.

SUMMARY

In general, a photovoltaic cell can include a transparent conductive layer, a first semiconductor layer, a light-absorbing semiconductor, the substrate supporting the semiconductor layers, a nitrogen-containing metal layer in contact with the semiconductor layer and additional conductive layers for electrical current transport.

A nitrogen-containing metal layer can include an aluminum nitride, a molybdenum nitride, a nickel nitride, a titanium nitride, a tungsten nitride, a selenium nitride, a tantalum nitride, or a vanadium nitride in contact with the semiconductor layer. A nitrogen-containing metal layer can include a stoichiometric nitride. In certain embodiments, a nitrogen-containing metal layer can include a non-stoichiometric nitride, for example, a nitrogen-deficient nitride.

In one aspect, a photovoltaic cell can further include a plurality of metal layers, such as a chromium layer and an aluminum layer, the aluminum layer positioned between the chromium layer and a nitrogen containing metal layer. In one aspect, the photovoltaic cell can also include a chromium layer, a molybdenum nitride, and an aluminum layer in between the chromium layer and the molybdenum nitride (Cr/Al/MoN).

In another aspect, a system for generating electrical energy can include a multilayered photovoltaic cell, the photovoltaic cell including a substrate, a transparent conductive layer, a first semiconductor layer, a light-absorbing semiconductor, a nitrogen containing metal layer in contact with the semiconductor layer, additional conductive layers connected to the nitrogen containing metal layer for electrical current transport, a first electrical connection connected to the transparent conductive layer, and a second electrical connection connected to the additional conductive layers.

In another aspect, a method of manufacturing a photovoltaic cell can include placing an absorber semiconductor layer on a substrate and depositing a metal layer on the absorber semiconductor layer on substrate in the presence of nitrogen. A method of manufacturing a photovoltaic cell can further include placing a capping layer between the transparent conductive layer and the first semiconductor layer by depositing a thin layer on the transparent conductive layer.

A first semiconductor layer can include a binary semiconductor. The first semiconductor layer can include a Group II-VI semiconductor, such as CdS or CdTe. The photovoltaic cell can include a second semiconductor layer over the first semiconductor layer. The second semiconductor layer can include a binary semiconductor. The second semiconductor layer can include CdTe.

The photovoltaic cell can include a capping layer, the capping layer chemically isolating the transparent conductive layer from the semiconductor layer. The capping layer can isolate the transparent conductive oxide layer from contact with a semiconductor layer.

The transparent conductive layer can include a transparent conductive oxide. The transparent conductive oxide can include a tin oxide.

The details of one or more embodiments are set forth in the accompanying drawings and the description below. Other features, objects, and advantages will be apparent from the description and drawings, and from the claims.

DETAILED DESCRIPTION

Figure 1:
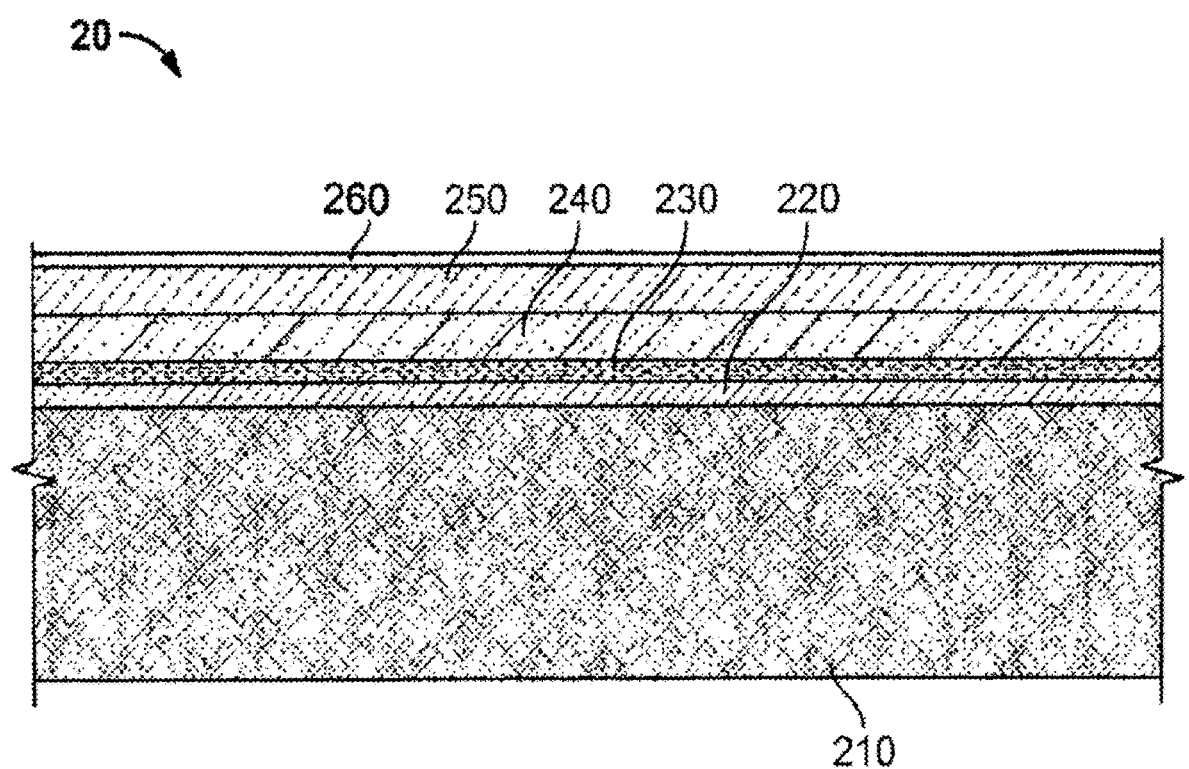
FIG. 1 is a schematic of a substrate with multiple layers.

A photovoltaic cell can include a transparent conductive layer on a surface of the substrate, a first semiconductor layer, the substrate supporting the semiconductor layer, and a nitrogen-containing metal layer in contact with the semiconductor layer.

A nitrogen-containing metal layer can include an aluminum nitride, a molybdenum nitride, a nickel nitride, a titanium nitride, a tungsten nitride, a selenium nitride, a tantalum nitride, or a vanadium nitride in contact with the semiconductor layer. A nitrogen-containing metal layer can include a stoichiometric nitride. In certain embodiments, a nitrogen-containing metal layer can include a non-stoichiometric nitride, for example, a nitrogen-deficient nitride.

In other circumstances, a nitrogen-containing metal layer can include an aluminum nitride, a nickel nitride, a titanium nitride, a tungsten nitride, a selenium nitride, a tantalum nitride, or a vanadium nitride in contact with the semiconductor layer.

In one embodiment, a photovoltaic cell can further include a plurality of metal layers, such as a chromium layer and an aluminum layer, the aluminum layer positioned between the chromium layer and a nitrogen containing metal layer. In another embodiment, the photovoltaic cell can also include a chromium layer, a molybdenum nitride, and an aluminum layer in between the chromium layer and the molybdenum nitride (Cr/Al/MoN).

A metal layer can include a single elemental layer or layers from multiple elements to increase photovoltaic cell efficiency. A metal layer can include rhodium, platinum, palladium, niobium, gold, lead, iridium or tin, or alloy thereof, for example.

Depositing a metal layer that is reacted with nitrogen during sputtering can increase the resistivity of the metal layer, resulting in an increase in photovoltaic cell efficiency. Thus, the amount of electrical energy produced as a percentage of the incident solar energy can be increased as a result of incorporating nitrogen into a metal layer. Incorporation of nitrogen into a metal film can be achieved by using a nitrogen gas supply along with argon in the sputtering system or using a premixed nitrogen/argon gas cylinder. Similar results can be achieved by using a compound target that is mixed with desired levels of nitrogen and sputtered in argon or argon/nitrogen ambient. The range of nitrogen, for a nitrogen and argon mixed ambient, can be as low as 1-2% to as high as 50% or 100% with no argon. The level of nitrogen used in the mixture affects the amount of nitrogen incorporation into the metal film. One can thus deposit a metal layer with various levels of nitrogen ranging from as low as a few atomic percent to close to stoichiometric or even greater than 50 atomic percent. Metal deposition can be carried out without any intentional heating of the substrate. Substrate heating, however, is one of the primary process variables that is known to affect film properties including incorporation of gas-phase impurities such as nitrogen.

A common photovoltaic cell can have multiple layers. The multiple layers can include a bottom layer that is a transparent conductive layer, a capping layer, a window layer, an absorber layer, and a top layer. Each layer can be deposited at a different deposition station of a manufacturing line with a separate deposition gas supply and a vacuum-sealed deposition chamber at each station as required. The substrate can be transferred from deposition station to deposition station via a rolling conveyor until all of the desired layers are deposited. Additional layers can be added using other techniques such as sputtering. Electrical conductors can be connected to the top and the bottom layers respectively to collect the electrical energy produced when solar energy is incident onto the absorber layer. A top substrate layer can be placed on top of the top layer to form a sandwich and complete the photovoltaic cell.

The bottom layer can be a transparent conductive layer, and can be, for example, a transparent conductive oxide such as tin oxide or tin oxide doped with fluorine. Deposition of a semiconductor layer at high temperature directly on the transparent conductive oxide layer can result in reactions that negatively impact the performance and stability of the photovoltaic device. Deposition of a capping layer of material with a high chemical stability (such as silicon dioxide, dialuminum trioxide, titanium dioxide, diboron trioxide and other similar entities) can significantly reduce the impact of these reactions on device performance and stability. The thickness of the capping layer should be minimized because of the high resistivity of the material used. Otherwise a resistive block counter to the desired current flow may occur. Capping layers are described, for example, in U.S. Patent Publication 20050257824, which is incorporated by reference in its entirety.

The thickness of the capping layer can be from greater than about 10 Å. In certain circumstances, the thickness of the capping layer can be less than about 500 Å. For example, the thickness of the capping layer can be greater than 20 Å, greater than 50 Å, greater than 75 Å or greater than 100 Å. For example, the thickness of the capping layer can be less than 250 Å, less than 200 Å, less than 150 Å, less than 125 Å, less than 100 Å, less than 75 Å or less than 50 Å. Complete coverage of the transparent conductive oxide layer may not occur. The capping layer can reduce the surface roughness of the transparent conductive oxide layer by filling in irregularities in the surface, which can aid in deposition of the window layer and can allow the window layer to have a thinner cross-section. The reduced surface roughness can help improve the uniformity of the window layer. Other advantages of including the capping layer in photovoltaic cells can include improving optical clarity, improving consistency in band gap, providing better field strength at the junction, and providing better device efficiency as measured by open circuit voltage loss.

The window layer and the absorbing layer can include, for example, a binary semiconductor such as group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof. An example of a window layer and absorbing layer is a layer of CdS coated by a layer of CdTe. A top layer can cover the semiconductor layers. The top layer can include a metal such as, for example, aluminum, molybdenum, nickel, titanium, tungsten, or alloys thereof.

Deposition of semiconductor layers in the manufacture of photovoltaic devices is described, for example, in U.S. Pat. Nos. 5,248,349, 5,372,646, 5,470,397, 5,536,333, 5,945, 163, 6,037,241, and 6,444,043, each of which is incorporated by reference in its entirety. The deposition can involve transport of vapor from a source to a substrate, or sublimation of a solid in a closed system. An apparatus for manufacturing photovoltaic cells can include a conveyor, for example a roll conveyor with rollers. Other types of conveyors are possible. The conveyor transports substrate into a series of one or more deposition stations for depositing layers of material on the exposed surface of the substrate. The deposition chamber can be heated to reach a processing temperature of not less than about 450° C. and not more than about 700° C., for example the temperature can range from 450-550° C., 550-650° C., 570-600° C., 600-640° C. or any other range greater than 450° C. and less than about 700° C. The deposition chamber includes a deposition distributor connected to a deposition vapor supply. The distributor can be connected to multiple vapor supplies for deposition of various layers or the substrate can be moved through multiple and various deposition stations with its own vapor distributor and supply. The distributor can be in the form of a spray nozzle with varying nozzle geometries to facilitate uniform distribution of the vapor supply.

The bottom layer can be a transparent conductive layer. A thin capping layer can be on top of and at least covering the transparent conductive layer in part. The next layer deposited is the first semiconductor layer, which can serve as a window layer and can be thinner based on the use of a transparent conductive layer and the capping layer. The next layer deposited is the second semiconductor layer, which serves as the absorber layer. Other layers can be deposited or otherwise placed on the substrate throughout the manufacturing process as needed.

Referring to FIG. 1, a cross section of the layers of a photovoltaic cell 20 has substrate 210 upon which are deposited the multiple layers used in the photovoltaic cell. The first layer deposited on the substrate is a thin film of a transparent conductive layer 220. This layer 220 can be a transparent conductive oxide, such as a metallic oxide like tin oxide, which can be doped with, for example, fluorine. Layer 230 can be deposited between the front contact and the first semiconductor layer 240, and can have a resistivity sufficiently high to reduce the effects of pinholes in the first semiconductor layer 240. Pinholes in the first semiconductor layer 240 can result in shunt formation between the second semiconductor layer 250 and the first contact resulting in a drain on the local field surrounding the pinhole. A small increase in the resistance of this pathway can dramatically reduce the area affected by the shunt.

A capping layer 230 can be provided to supply this increase in resistance. The capping layer 230 can be a very thin layer of a material with high chemical stability. The capping layer 230 can have higher transparency than a comparable thickness of semiconductor material having the same thickness. Examples of materials that are suitable for use as a capping layer include silicon dioxide, dialuminum trioxide, titanium dioxide, diboron trioxide, and other similar entities. Capping layer 230 can also serve to isolate the transparent conductive layer 220 electrically and chemically from the first semiconductor layer 240 preventing reactions that occur at high temperature that can negatively impact performance and stability. The capping layer 230 can also provide a conductive surface that can be more suitable for accepting deposition of the first semiconductor layer 240. For example, the capping layer 230 can provide a surface with decreased surface roughness. When using a transparent conductive layer 220 and a capping layer 230, the first semiconductor layer 240 can be thinner than in the absence of the capping layer. For example, the first semiconductor layer 240 can have a thickness of greater than about 10 nm and less than about 500 nm. For example, the first semiconductor layer can have a thickness greater than 20 nm, greater than 50 nm, greater than 100 nm, or greater than 200 nm and less than 400 nm, less than 300 nm, less than 250 nm, or less than 150 nm.

The first semiconductor layer 240 can serve as a window layer for the second semiconductor layer 250. By being thinner, the first semiconductor layer 240 allows greater penetration of the shorter wavelengths of the incident light to the second semiconductor layer 250. The first semiconductor layer 240 can be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof. It can be a binary semiconductor, for example it can be CdS. The second semiconductor layer 250 can be deposited onto the first semiconductor layer 240. The second semiconductor 250 can serve as an absorber layer for the incident light when the first semiconductor layer 240 is serving as a window layer. Similar to the first semiconductor layer 240, the second semiconductor layer 250 can also be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof.

Metal layer 260 can be a nitrogen-containing metal layer. A nitrogen-containing metal layer can include an aluminum nitride, a molybdenum nitride, a nickel nitride, a titanium nitride, a tungsten nitride, a selenium nitride, a tantalum nitride, or a vanadium nitride in contact with the semiconductor layer. A nitrogen-containing metal layer can include a stoichiometric nitride. In certain embodiments, a nitrogen-containing metal layer can include a non-stoichiometric nitride, for example, a nitrogen-deficient nitride.

In other circumstances, a nitrogen-containing metal layer can include an aluminum nitride, a nickel nitride, a titanium nitride, a tungsten nitride, a selenium nitride, a tantalum nitride, or a vanadium nitride in contact with the semiconductor layer.

The metal layer 260 can be deposited on a first semiconductor layer 240 or on a second semiconductor layer 250.

Figure 2:
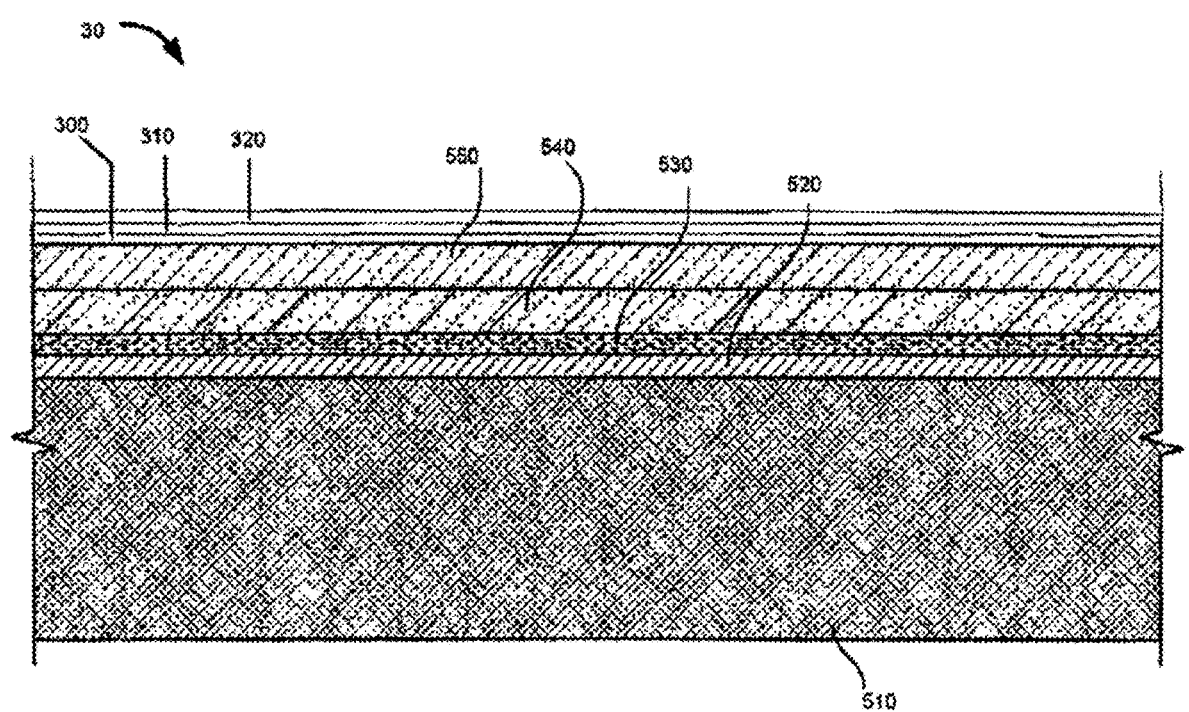
FIG. 2 is a schematic of a substrate with multiple layers.

Referring to FIG. 2, a photovoltaic cell 30 can further include a plurality of metal layers, such as a chromium layer 320 and an aluminum layer 310, the aluminum layer positioned between the chromium layer and a nitrogen containing metal layer 300. In another aspect, the photovoltaic cell can also include a chromium layer, a molybdenum nitride, and an aluminum layer in between the chromium layer and the molybdenum nitride (Cr/Al/MoN). A nitrogen containing metal layer 300 can be deposited on a second semiconductor layer 550 or on a first semiconductor layer 540.

The second semiconductor layer can be deposited onto a first semiconductor layer 540. A capping layer 530 can serve to isolate a transparent conductive layer 520 electrically and chemically from the first semiconductor layer preventing reactions that occur at high temperature that can negatively impact performance and stability. The transparent conductive layer can be deposited on a substrate 510.

A metal layer can be deposited onto a second semiconductor layer to act as a back metal electrode. A metal layer can be a single elemental layer or layers from multiple elements to increase photovoltaic cell efficiency. The first metal layer that is directly in contact with the top surface of the second semiconductor can be made more resistive for high photovoltaic cell efficiency. The resistivity of the first metal layer can be increased by depositing a metal under nitrogen and argon mixture as an ambient during sputtering. The amount of nitrogen incorporated into the first metal layer, and therefore resistivity, is dependent on the amount of nitrogen available during sputtering. Good photovoltaic cell efficiency results can be obtained when the sputtering ambient is composed of 13% Nitrogen and 87% Argon. Higher sheet resistance, thus obtained, allows for thinner metal layers, and can thereby reduce manufacturing cost. A first metal layer can include, for example, chromium, molybdenum, nickel, titanium, selenium or tungsten, or alloys thereof. A first metal layer can have a thickness of less than 500 nm, less than 100 nm, or less than 10 nm. A first metal layer can have a thickness greater than 2 nm and less than 100 nm. Additional layers can be subsequently deposited on top of the first metal layer to provide adequate conductivity to transport electrical charges out to external load. A second metal layer can include, for example, aluminum, copper, nickel, tungsten, lead, or molybdenum, using argon as a sputtering gas. The second metal layer can be as thick as 500 nm to as thin as 100 nm, for example. The second metal layer can be capped with a thin layer of less corrosive metal such as chromium to prevent oxidation during subsequent processing or operation of photovoltaic panels. The thickness of the capping layer can be as thick as 50 nm to as thin as 10 nm.

Devices that contain metal nitrides can improve photovoltaic cell efficiency. Photovoltaic panels containing molybdenum nitrides have shown an improved efficiency of at least 0.05%, 0.10%, and 0.20% efficiency greater than chromium nitrides. In the following examples, devices were finished with appropriate back contacts. Testing for results of these devices was performed at initial efficiency, and after accelerated stress testing using UV measurements on a solar simulator. For example, photovoltaic panels containing $MoN_x$ had a 0.2%-0.4% point higher efficiency than those containing $CrN_x$. Stability of photovoltaic panels under accelerated light soak was carried out for comparison between $MoN_x$ and $CrN_x$ revealed improved performance of the $MoN_x$ devices, with no negative impact on metal layer adhesion.

A number of embodiments have been described. Nevertheless, it will be understood that various modifications may be made without departing from the spirit and scope of the invention. For example, the semiconductor layers can include a variety of other materials, as can the materials used for the buffer layer and the capping layer. Accordingly, other embodiments are within the scope of the following claims.

What is claimed is:

1. A method of manufacturing a photovoltaic cell comprising:
    forming a first semiconductor layer over a substrate, wherein the first semiconductor layer comprises CdTe, CdSe, or mixtures thereof;
    forming a second semiconductor layer over the first semiconductor layer, wherein the second semiconductor layer comprises ZnTe;
    depositing a metal layer over the second semiconductor layer in the presence of nitrogen to form a nitrogen-containing metal layer in contact with the second semiconductor layer, wherein the nitrogen-containing metal layer includes an aluminum nitride, a molybdenum nitride, a nickel nitride, a titanium nitride, a tungsten nitride, a selenium nitride, a tantalum nitride, or a vanadium nitride;
    depositing an aluminum layer over the nitrogen-containing metal layer; and
    depositing a chromium layer over the aluminum layer.

2. The method of claim 1, further comprising:
    placing a transparent conductive layer on the substrate; and
    placing a capping layer between the transparent conductive layer and the first semiconductor layer.

3. The method of claim 1, wherein the step of depositing the metal layer over the second semiconductor layer in the presence of nitrogen further comprises: sputtering in a nitrogen gas mixture comprising 2% to 50% nitrogen.

4. The method of claim 1, wherein the step of depositing the metal layer over the second semiconductor layer in the presence of nitrogen further comprises: sputtering in a nitrogen argon gas mixture composed of 13% nitrogen and 87% argon.

5. The method of claim 2, wherein the nitrogen-containing metal layer comprises an atomic percent nitrogen in a range between 1 percent and 50 percent.

6. The method of claim 1, further comprising:
    transporting the substrate into a series of one or more deposition stations on a conveyor, wherein at least one deposition station comprises a deposition chamber heated to a processing temperature in a range from about 450° C. to about 700° C., and
    depositing a semiconductor material over the substrate, thereby forming at least one of the first semiconductor layer or the second semiconductor layer.

7. The method of claim 1, wherein the step of forming the first semiconductor layer comprises transport of vapor from a source to the substrate.

8. A method of manufacturing a photovoltaic cell comprising:
    transporting a substrate into a series of one or more deposition stations on a conveyor, wherein at least one deposition station comprises a deposition chamber heated to a processing temperature in a range from about 450° C. to about 700° C.;
    depositing a transparent conductive oxide layer over the substrate;
    depositing a first semiconductor layer over the transparent conductive oxide layer by transport of vapor from a source to the substrate;
    depositing a nitrogen-containing metal layer over the first semiconductor layer by sputtering a first metal in the presence of nitrogen to form the nitrogen-containing metal layer,
        wherein the first metal is selected from the group consisting of: aluminum, molybdenum, nickel, titanium, tungsten, selenium, tantalum, vanadium, and combinations thereof;
        whereby the nitrogen-containing metal layer comprises one or more of: aluminum nitride, molybdenum nitride, nickel nitride, titanium nitride, tungsten nitride, selenium nitride, tantalum nitride, or vanadium nitride;
    depositing a second metal layer over and in contact with the nitrogen-containing metal layer,
        wherein the second metal is selected from the group consisting of: aluminum, copper, nickel, tungsten, lead, molybdenum, and combinations thereof; and
        wherein depositing the second metal layer comprises sputtering using argon as a sputtering gas; and
    depositing a chromium layer over and in contact with the second metal layer.

* * * * *